United States Patent [19]

Ferreri et al.

[11] Patent Number: 5,347,465

[45] Date of Patent: Sep. 13, 1994

[54] METHOD OF INTEGRATED CIRCUIT CHIPS DESIGN

[75] Inventors: Raymond J. Ferreri, Stormville; Glenn E. Holmes, Wappingers Falls; Steven Magdo, Hopewell Junction, all of N.Y.

[73] Assignee: International Business Machines Corporation, Armonk, N.Y.

[21] Appl. No.: 881,961

[22] Filed: May 12, 1992

[51] Int. Cl.$^5$ ............................................. G06F 15/60
[52] U.S. Cl. ..................................... 364/488; 364/491
[58] Field of Search ................. 364/488, 489, 490, 491

[56] References Cited

U.S. PATENT DOCUMENTS

| | | | |
|---|---|---|---|
| 4,500,963 | 2/1985 | Smith et al. | 364/300 |
| 4,613,941 | 9/1986 | Smith et al. | 364/490 |
| 4,651,190 | 3/1987 | Suzuki et al. | 357/45 |
| 4,651,284 | 3/1987 | Watanabe et al. | 364/491 |
| 4,829,014 | 5/1989 | Yerman | 437/8 |
| 4,880,754 | 11/1989 | Correale | 437/51 |
| 4,910,574 | 3/1990 | Aipperspach et al. | 357/40 |
| 4,922,432 | 5/1990 | Kobayashi et al. | 364/490 |
| 4,960,724 | 10/1990 | Watanabe et al. | 437/51 |
| 4,964,057 | 10/1990 | Yabe | 364/491 |
| 5,023,701 | 6/1991 | Sharpe-Geisler | 357/71 |
| 5,097,422 | 3/1992 | Corbin, II et al. | 364/491 |
| 5,128,871 | 7/1992 | Schmitz | 364/490 |
| 5,247,456 | 9/1993 | Ohe et al. | 364/491 |

OTHER PUBLICATIONS

IBM Technical Disclosure Bulletin, Selective Removal of Polysilicon To Obtain Improved Masterslice, vol. 31, Sep. 1988.

*Primary Examiner*—Thomas G. Black
*Assistant Examiner*—Susan Wieland
*Attorney, Agent, or Firm*—Whitham, Curtis, Whitham & McGinn

[57] ABSTRACT

An automated, custom personalization process for generating integrated gate array chips is defined which enhances yield and reliability potential. Unused data provided in the general purpose design is deleted through a selective detection procedure based on circuit utilization.

2 Claims, 4 Drawing Sheets

METHOD OF INTEGRATED CIRCUIT CHIPS DESIGN

DESCRIPTION

BACKGROUND OF THE INVENTION

1. Field of the Invention

This invention relates to a method of increasing the yield and reliability of integrated circuit chips manufactured from gate arrays and, more particularly, to an improved method of designing and implementing metallization patterns for such gate arrays.

2. Description of the Prior Art

As will be appreciated by those skilled in the art, the so-called gate array (also referred to in the art as a masterslice) approach is widely used to produce semiconductor integrated circuit chips. Gate array refers to an array (matrix) of devices, such as resistors and transistors, that can be connected as logic gates. In a gate array process, a fixed number of uncommitted and unconnected devices are pregrouped into a cell. A number of identical cells are arranged in rows and columns on a chip, with space between and above them reserved for interconnections. This allows a large number of identical wafers to be fabricated and later personalized in different ways to fabricate specific chip functions. To implement a specific chip function, a designer specifies circuit functions and their interconnects, and a computer-aided design program specifies the metallization data that will make the connections between the circuits to implement the desired chip function in the array. Programs are available to generate metallization data for forming photolithographic masks and for direct write electron beam fabrication.

FIG. 1 illustrates a typical prior art gate array computer design program to which the teachings of this invention are applicable. The program elements include a Circuit Library, a Gate Array Description, a Chip Functional Description and Fixed Metal.

The Circuit Library contains a computer stored data base of metallization data required to implement individual logic functions (e.g., OR, AND, XOR, etc.) from the devices in a gate array cell.

The Gate Array Description is a stored data image, describing cell locations, allowed interconnect paths and areas reserved for power bussing.

The Chip Functional Description is a database of circuit functions and their interconnects required to perform the chip function prescribed by a designer for a specific application.

The Fixed Metal is a database of metallization data required to provide power to all cell locations on a chip, thus allowing all possible circuit placements. Here it should be noted that, due to density optimization of gate array cell designs, non-symmetries exist in the cells. These are usually restricted to the power supply distribution in the Fixed Metal.

In a Placement step, the computer aided design program optimally places the required circuits in the gate array cells, as dictated by the Chip Functional Description.

A Wiring step uses maze routing code to describe physical interconnections between placed circuits as prescribed by the Chip Functional Description. The output of the Wiring step is metallization data specifying a pattern of wires and inter-level via connections referred to as Global Metal.

A step called Shapes Creation and Check includes Combine and Pattern Creation steps in which the circuit, global and fixed metallization data are combined to create an output for forming the complete metallization pattern.

The value of a gate array only exists when all logic elements properly process signals from chip inputs to chip outputs. Thus, the metallization pattern must exist without fault. The Fixed Metal in the gate arrays must be designed to accept any circuit since, prior to the Placement step, it is unknown which circuit will be placed in a particular cell. In particular, since any cell may be occupied, the Fixed Metal must supply power to all cell locations. If the Fixed Metal does not satisfy the circuit requirements in all cells, a non-functional product could result.

The advantages of gate arrays over fully customized cells are: shorter design turnaround time, low cost through mass production of non-personalized gate array chips, the need for fewer masks, and shorter fabrication time since only the final metallization pattern and contact layers need to be customized. A disadvantage is wasted chip area, which results from the fact that, in general, all cells are not used. Moreover, the Fixed Metal provided to unused cells to support general applications becomes a source for yield and reliability reductions. A prior art method of reducing Fixed Metal in gate arrays involves photolithographic removal of the Fixed Metal after chip fabrication. However, this method is undesirable due to the increase in overall time and process complexity.

FIGS. 2A and 2B show a schematic diagram of a logic gate and a pictorial representation of this logic gate implemented on a typical gate array cell. The Fixed Metal is represented by the cross-hatched areas. The Circuit Metal is represented by clear shapes. An unused fixed metal shape 1 is one which does not contact circuit metal 3. Certain individual circuit types require only portions of the total power supplied to each cell. Also gate array chips typically do not place circuits in all cells. Hence, excess Fixed Metal exists for cells which contain placed circuits as well as for entire cells.

SUMMARY OF THE INVENTION

An object of this invention is to increase the yield and reliability of satisfactory chips manufactured using a gate array process of the type described above.

It will be appreciated that the final cost of hardware chips is directly related to this yield, that is, the ratio of satisfactory chips to all chips manufactured. Moreover, the intrinsic value of these yielded chips is directly related to their reliability over their lifetime.

Two primary failure modes that decrease yield and reliability of semiconductor integrated circuit chips are inter and intra-level metallization short circuits. Applicants have studied the effects of minimizing these failure modes and have determined that failure mechanisms can be reduced, and yield improved, by eliminating data that generates unused metallization for a particular personalization. In accordance with the teachings of this invention, Fixed Metal dictated by the general purpose nature of the gate array, but not required for specific operation of a personalized functional circuit, is identified and deleted by a computer program prior to depositing a metal pattern on a semiconductor substrate. This allows the gate array to be fabricated in final form; i.e., without the need for further processing steps to remove unused Fixed Metal.

In a specific embodiment of the invention, the personalized circuit metallization data is entered into a computer. A nonphysical representation of the intended chip design is generated by the computer software. High level software commands are then used to sense the need for each individual fixed metal shape, i.e., configuration of electronics. Fixed metal shapes that do not contact Circuit Metal are eliminated from the data output used for mask creation or direct write electron beam control. A gate array chip is then fabricated from this final data output.

BRIEF DESCRIPTION OF THE DRAWINGS

The foregoing and other objects, aspects and advantages will be better understood from the following detailed description of a preferred embodiment of the invention with reference to the drawings where like reference numerals designate like components in the various figures, and in which.

DETAILED DESCRIPTION OF A PREFERRED EMBODIMENT OF THE INVENTION

Figure 1:
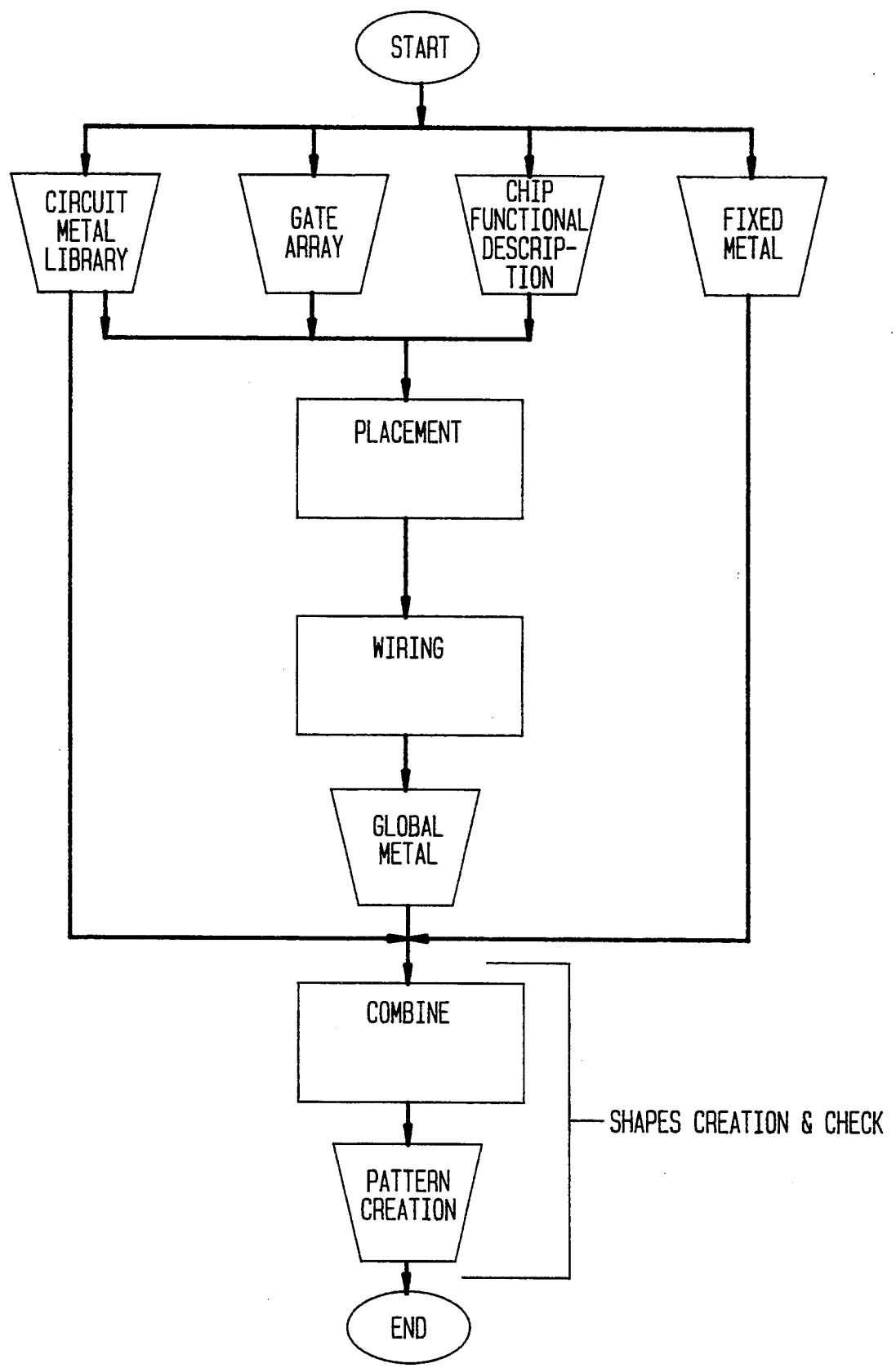
FIG. 1 is a high-level flow diagram of a prior art program for personalizing gate arrays.
Figure 2A:
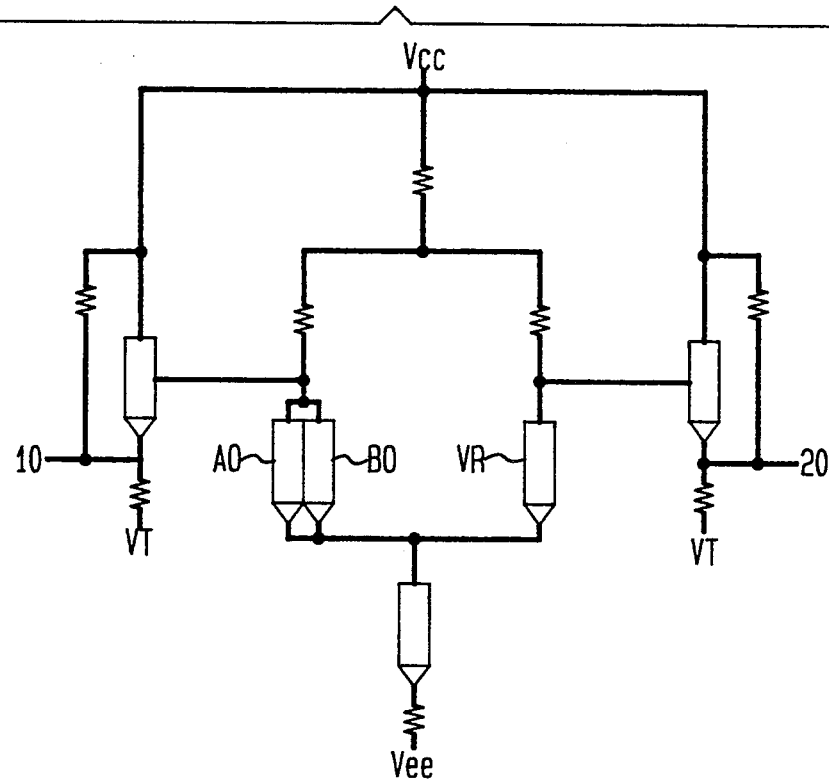
FIGS. 2A and 2B show a schematic diagram of a logic gate and a pictorial representation of this logic gate implemented in a gate array chip by means of a conventional prior art metallization program. This pictorial representation illustrates a fixed metal shape that is unused and is eliminated in accordance with the teachings of this invention.
Figure 2B:
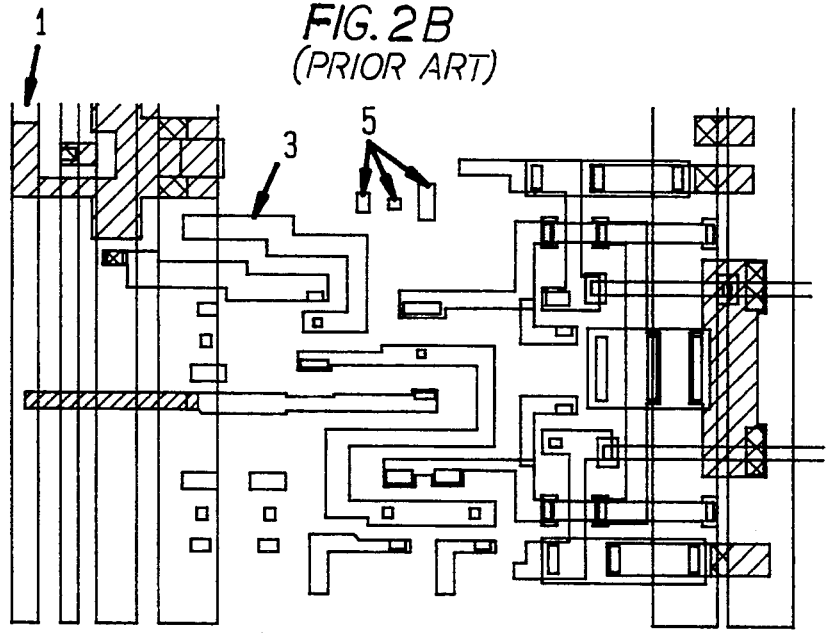
Figure 3:
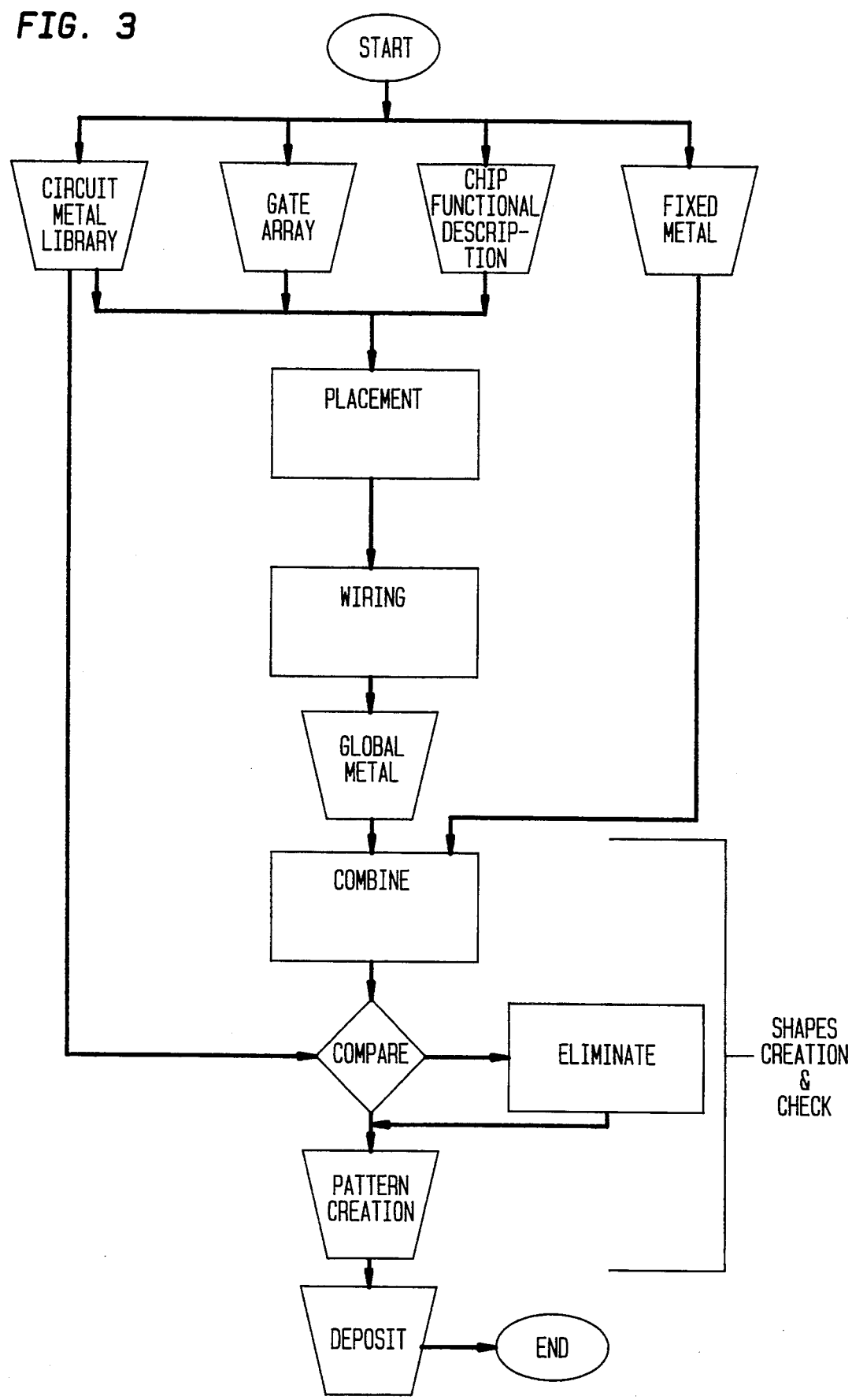
FIG. 3 is a high-level flow diagram, similar to that of FIG. 1, of a program for personalizing gate arrays in accordance with the teachings of this invention.

Referring now to the drawings, and more particularly to FIG. 3, a high level flow diagram of a program for personalizing gate arrays in accordance with the teachings of this invention is shown. As in the prior art gate array computer design program, the program elements of the present invention include a Circuit Library, a Gate Array Description, a Chip Functional Description and Fixed Metal. The Circuit Library is a computer stored data base of metallization data required to implement individual logic functions from the devices in a gate array cell, while the Gate Array Description is a stored data image, describing cell locations, allowed interconnect paths and areas reserved for power bussing. The Chip Functional Description is a database of circuit functions and their interconnects required to perform the chip function prescribed by a designer for a specific application. The Fixed Metal is a database of the metallization data required to provide power to all cell locations on a chip, thus allowing all possible circuit placements. The required databases for circuit and fixed metal are created utilizing conventional custom design tools.

As in the prior art, a Placement step involves optimally placing the required circuits in the gate array cells and the Wiring step uses maze routing code to describe physical interconnections between placed circuits as prescribed by the Chip Functional Description. The output of the Wiring step is data specifying a pattern of wires and inter-level via connections referred to as Global Metal.

In the method of the present invention, the prior art Shapes Creation and Check step has been modified to further include Compare and Eliminate steps. As in the prior art Combine step, the circuit, global and fixed metallization patterns are combined according to a custom logic design specified by a system designer. This design is then entered into a computer system which verifies, through simulation, whether the patterns are properly designated and are valid. If the patterns are properly selected and coded, the computer system produces a non-physical representation of the specified chip design, which includes detailing block assignments and locations, blockages and routed interconnections. In a preferred embodiment, the Compare step identifies which Fixed Metal connecting metallization shapes are unused. This involves using the placed circuit metallization pattern as a reference for the computer to sense the need for required fixed metal shapes. More specifically, the computer searches for fixed metal shapes that do not contact Circuit Metal. The search may be performed using high level computer commands found in computer software which is commercially available from such sources as Cadence. In the Eliminate step, unused fixed metal shapes are removed from the non-physical representation. The deletion of fixed metal shapes can extend through the various metal layers of the custom logic design including metal and vias. In the Pattern Creation step, the final metallization data pattern for the gate array is generated by combining the circuit metal data pattern and the modified fixed metal data pattern. Pattern Creation may include mask creation or direct write electron beam control data. In the final Deposit step, metal is deposited on a substrate in a deposit pattern which is dictated by the final metallization data pattern.

Figure 4:
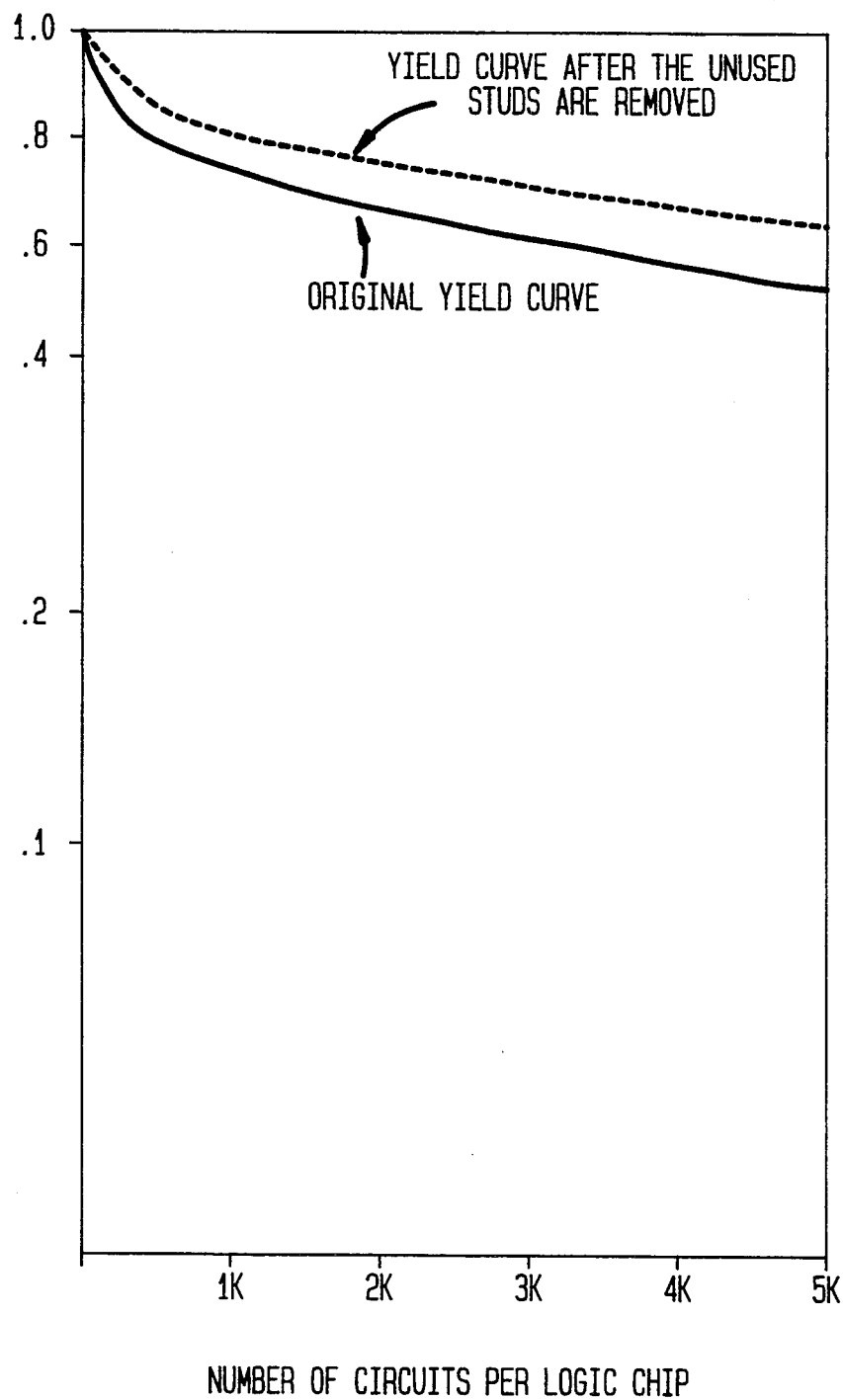
FIG. 4 shows a plot of yield versus number of circuits before and after removal of unused Fixed Metal.

This final metallization pattern created using the method of the present invention exhibits higher chip yield than the pattern created using previous methods. As shown by the yield curves in FIG. 4, this improvement can be as much as 11%, depending on the circuit density of the chip. These curves were derived from yield data of Via Chains, since they measure one of the prime yield-limiting failure mechanisms improved by this invention, i.e., via to metal shorts. Via Chains are strings of vias and adjacent metal lines assembled in product-like relationships and in specific locations on the wafer. These chains contain a sufficient quantity of vias and metal lines to confidently determine the probability of chip failure due to metal to via shorts. This probability is then combined with the probabilities of chip failure due to other similar chain-measured yield-limiting failure mechanisms to determine the overall chip yield. Since this combination of individual probabilities is a mathematical product, a percentage increase in any one of the probabilities is reflected as the same percentage increase in the overall chip yield. Thus, the percentage improvement in the metal to via short yield as shown in FIG. 4, represents the same percentage improvement, 11%, in the overall chip yield.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method of personalizing a gate array from a plurality of circuit cells that have been formed in a semiconductor substrate to a specified functional design in which a personalized gate array utilizes less than all of said plurality of circuit cells, comprising the steps of:

generating a global metal data pattern and a circuit metal data pattern providing global interconnecting metallization and circuit metal interconnecting metallization for interconnecting less than all of said plurality of circuit cells to form said personalized gate array based upon said specified functional design;

providing a fixed metal data pattern for providing fixed metal connecting metallization shapes to couple power to all of said plurality of circuit cells;

identifying, in said fixed metal data pattern, fixed metal data related to fixed metal shapes that are unused in said personalized gate array;

generating a modified fixed metal data pattern by deleting from said fixed metal data pattern fixed metal data related to said unused fixed metal shapes identified in said identification step; and generating a metallization data pattern for said gate array by combining said circuit metal data pattern, said global metal data pattern and said modified fixed metal data pattern.

2. A method as recited in claim 1 wherein said step of identifying comprises identifying said fixed metal connecting metallization shapes in said fixed metal data pattern that do not contact said circuit metal interconnecting metallization.

* * * * *